United States Patent [19]

Okoshi et al.

[11] Patent Number: 5,665,473

[45] Date of Patent: Sep. 9, 1997

[54] PACKAGE FOR MOUNTING A SEMICONDUCTOR DEVICE

[75] Inventors: Tokio Okoshi; Yuka Kato; Hideki Okoshi; Kenichiro Miyahara; Masakatsu Maeda, all of Tokuyama, Japan

[73] Assignee: Tokuyama Corporation, Tokuyama, Japan

[21] Appl. No.: 527,225

[22] Filed: Sep. 12, 1995

[30] Foreign Application Priority Data

Sep. 16, 1994 [JP] Japan .................. 6-222165
Dec. 14, 1994 [JP] Japan .................. 6-310680

[51] Int. Cl.⁶ ...................................... B32B 9/00
[52] U.S. Cl. ................... 428/457; 428/209; 428/343; 428/344; 428/458; 428/688; 428/901; 361/719
[58] Field of Search ................... 361/719; 428/688, 428/344, 457, 343, 458, 901, 209

[56] References Cited

U.S. PATENT DOCUMENTS

| | | | |
|---|---|---|---|
| 4,374,890 | 2/1983 | Shimizu | 428/457 |
| 4,456,652 | 6/1984 | Konishi | 428/344 |
| 4,961,987 | 10/1990 | Okuno | 428/688 |
| 5,467,251 | 11/1995 | Katchmar | 361/719 |
| 5,510,174 | 4/1996 | Litman | 428/344 |

*Primary Examiner*—Patrick Ryan
*Attorney, Agent, or Firm*—Beveridge, DeGrandi, Weilacher & Young L.L.P.

[57] ABSTRACT

A package for mounting a semiconductor device comprises a base plate and a conductive layer laminated onto the base plate via an adhesive layer. The modulus of elasticity at 25° C. of the adhesive layer is 10 kg/mm² or less.

18 Claims, 4 Drawing Sheets

PACKAGE FOR MOUNTING A SEMICONDUCTOR DEVICE

FIELD OF THE INVENTION

This invention relates to a package for mounting a semiconductor device, including a base plate and a conductive layer laminated onto the base plate via an adhesive layer.

DESCRIPTION OF THE PRIOR ART

U.S. Pat. Nos. 4,835,120 and 4,891,687, both issued to Mallik et al., disclose packages for semiconductor devices, including a plurality of conductive layers, i.e., a power layer, a ground layer and a signal layer, laminated together via insulating tapes. Both sides of each insulating tape are coated with a polyimide adhesive. Thus, the power layer, the ground layer and the signal layer are bonded together via the insulating tapes. At the center of the package is defined a mounting cavity, where a semiconductor device which may be a semiconductor chip is mounted. Then, the entire package is encapsulated in a molded resin.

Such a semiconductor device mounting system poses the problem that the entire package is encapsulated in resin, thus lowering the heat dissipation of the semiconductor device and making the entire system considerably bulky. One of the ideas for solving this problem is to omit the encapsulation in resin. Omission of the resin encapsulation, however, results in the insufficient rigidity of the package, thus making it impossible to retain the semiconductor device stably. When the semiconductor device is to be sealed by bonding a sealing cap at a required position of the package, moreover, the sealing properties can be easily destroyed.

To solve the above-mentioned problem while increasing the rigidity of the package, it can be proposed to laminate a conductive layer, such as a power layer, a ground layer or a signal layer, onto a base plate of a material, such as a ceramic or a suitable metal, via an adhesive layer, the base plate having a certain thickness and relatively high rigidity. According to our experience, however, the use of such a base plate has produced still unsatisfactory results and involved the following problems: Since there is a considerable difference in the coefficient of thermal expansion between the base plate and the conductive layer laminated thereon, the conductive layer tends to peel off the base plate under heat history, meaning insufficient heat stability. When the semiconductor device is sealed by bonding a sealing cap at a required site of the package, this peeling destroys the sealing properties. Furthermore, when the conductive layer is formed of a flat piece with a relatively broad area, a warp develops in the entire package including the base plate, lowering the reliability of the semiconductor device. Warpage of the entire package also damages the seal produced by the sealing cap. The warpage of the entire package including the base plate can be prevented by increasing the thickness of the base plate. Too large a thickness of the base plate, however, would increase the weight and size of the entire package excessively and the considerable difference in the coefficient of the thermal expansion is left over.

With a package having a multiplicity of outer connecting terminals disposed therein, the following problem arises: If the integration level of the semiconductor device is high, the inductance of the electrical connecting means for connecting the power layer and the ground layer to the outer connecting terminals (those electrical connecting means extending in through-holes formed in the package) becomes relatively large, thereby generating a considerable noise during the high speed operation of the semiconductor device, which may cause malfunctions.

SUMMARY OF THE INVENTION

Therefore, an object of the present invention is to improve the heat stability of a package for mounting a semiconductor device, comprising a base plate and at least one conductive layer laminated onto the base plate via an adhesive layer, and prevent the occurrence of warpage.

Another object of the invention is to provide an improved package for mounting a semiconductor device, which fully reliably maintains the seal of the semiconductor device by a sealing cap bonded at a required position of the package.

Still another object of the invention is to provide a package having a multiplicity of outer connecting terminals disposed therein, wherein although the integration level of the semiconductor device is high, the inductance of the electrical connecting means connecting the power layer and the ground layer to the outer connecting terminals is sufficiently low, so that the generation of a noise is fully suppressed during the high speed operation of the semiconductor device, and malfunctions can be prevented without fail.

Our extensive studies have led to the following findings: Between the base plate and the conductive layer is interposed an adhesive which has rubberlike elasticity after curing, instead of an adhesive in common use, such as a polyimide adhesive or an insulating tape coated with a polyimide adhesive on both sides. By so doing, the heat stability of the package for mounting a semiconductor device can be improved, and the occurrence of warpage can be fully suppressed. In addition, when the semiconductor device is to be sealed by a sealing cap, the seal can be maintained fully reliably.

That is, the present invention provides a package for mounting a semiconductor device, comprising a base plate and at least one conductive layer laminated onto the base plate via an adhesive layer, wherein the modulus of elasticity at 25° C. of the adhesive layer is 10 kg/mm$^2$ or less. The modulus of elasticity refers to modulus in tension which is measured by the measuring method defined in JIS C 2321 and ASTM D-882.

The parameter "90° peel strength" between the base plate and the conductive layer is 0.5 kg/cm or more, preferably, 1 kg/cm or more. The 90° peel strength refers to the force necessary to peel a 1 cm wide conductive layer, bonded onto a base plate via an adhesive layer, from the base plate by pulling the conductive layer in a direction of 90° with respect to the surface of the base plate. Preferably, the modulus of elasticity at 25° C. of the adhesive layer is 0.01 to 10 kg/mm$^2$, more preferably 0.03 to 5 kg/mm$^2$, most preferably 0.05 to 2 kg/mm$^2$. The adhesive layer may be composed of an adhesive containing a filler. The filler is silica and/or alumina, and the average particle diameter of the filler is 0.1 to 100 µm, preferably 0.3 to 30 µm. The amount of the filler incorporated is 1 to 80% by weight, preferably 5 to 70% by weight, based on the entire adhesive including the filler. Preferably, the viscosity of the adhesive layer in the uncured condition is 50 to 1000 Pa's, and the thickness of the adhesive layer is 0.005 to 3 mm. The base plate may be an aluminum nitride ceramic. The conductive layer comprises a power layer, a ground layer and a signal layer, and advantageously has the adhesive layer interposed between the adjacent layers. The signal layer may be composed of a multiplicity of ribbonlike leads. Preferably, an insulating hard resin layer is disposed on the inner surface of each of the inner leads of the multiple leads. In the case of a package having a multiplicity of outer connecting terminals disposed therein, connecting means for electrically connecting the power layer and the ground layer to the outer connecting terminals preferably extend on the outer surface of the package so as to have a sufficiently large cross sectional area and a sufficiently low inductance.

DETAILED DESCRIPTION OF THE PREFERRED EMBODIMENTS

Preferred embodiments of a package for mounting a semiconductor device in accordance with the present invention will be described in more detail with reference to the accompanying drawings.

Figure 1:
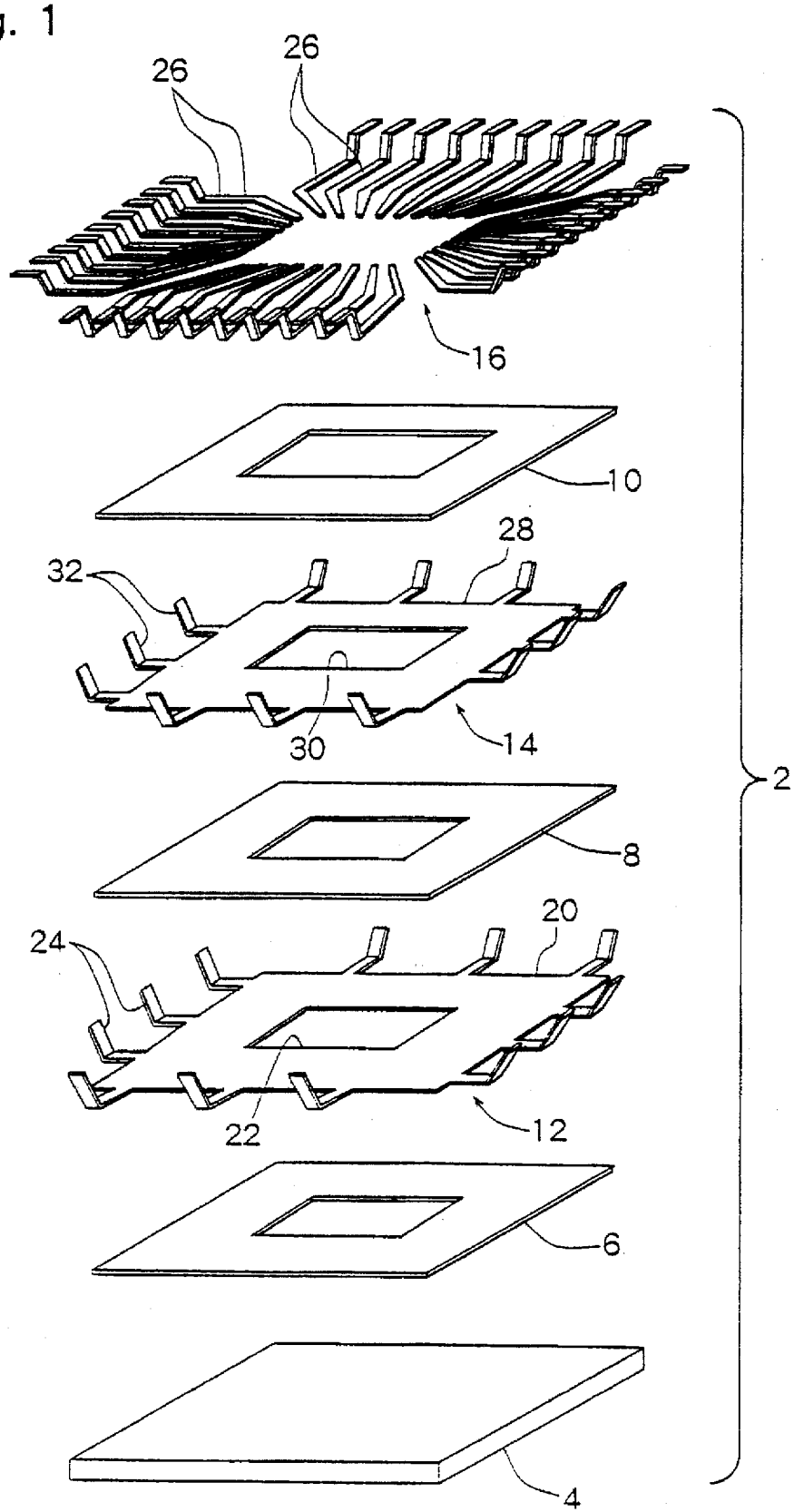
FIG. 1 is an exploded perspective view showing a preferred embodiment of a package for mounting a semiconductor device in accordance with the present invention.
Figure 2:
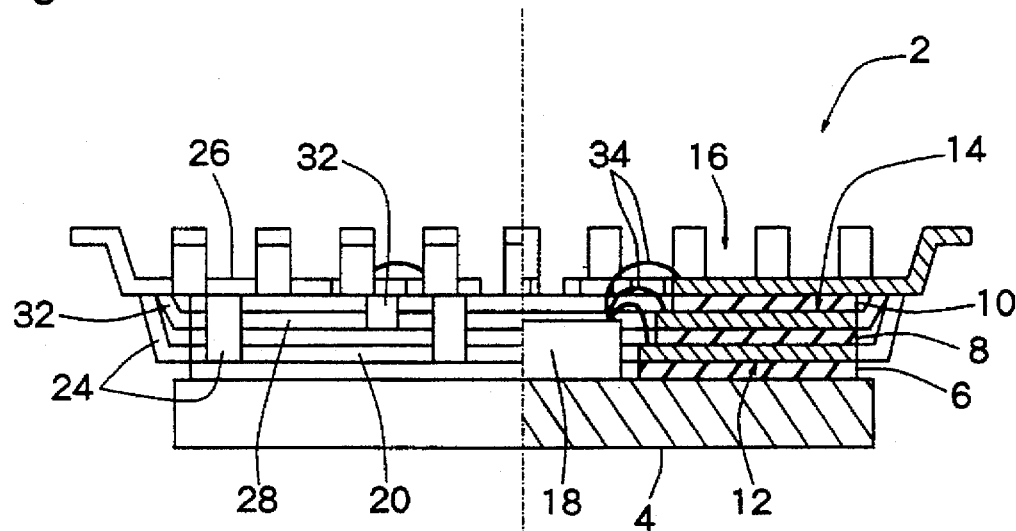
FIG. 2 is a front view, partly in cross section, of the package shown in FIG. 1.

FIGS. 1 and 2 illustrate a first preferred embodiment of a package for mounting a semiconductor device according to the present invention. A package shown generally at the numeral 2 has a base plate 4, and three conductive layers, i.e., a power layer 12, a ground layer 14 and a signal layer 16, laminated onto the base plate 4 via adhesive layers 6, 8 and 10, respectively, interposed between the adjacent layers.

The base plate 4, optionally rectangular in shape, may be formed of a suitable material having required rigidity, such as a ceramic or a metal. Typical examples of the ceramic are oxides such as alumina, mullite, beryllia, glass ceramics and magnesia; nitrides such as aluminum nitride, silicon nitride and boron nitride; and carbides such as silicon carbide and boron carbide. Such a ceramic is normally white, light gray or pink in color. To improve shading and/or facilitate photoelectronic detection during automatic assembly, however, a colorant may be incorporated to impart a color, such as black, dark gray, brown or black purple, to the ceramic.

Examples of the metal that can be used advantageously to form the base plate are copper, copper alloys, aluminum, aluminum alloys, kovar (representative composition: 25–35 wt. % Ni, 15–20 wt. % Co and the remainder being Fe), Alloy 42 (representative composition: 40–44 wt. % Ni and the remainder being Fe), invar (representative composition: 31–37 wt. % Ni, 0–5 wt. % Co and the remainder being Fe), tungsten, molybdenum, copper-tungsten alloy (representative composition: 1–40 wt. % Cu and the remainder being W), copper-molybdenum alloy (representative composition: 5–70 wt. % Cu and the remainder being Mo), double-sided copper clad molybdenum (representative thickness ratio: Cu/Mo/Cu=1/3/1 to 3/1/3), and double-sided copper clad invar (representative thickness ratio: Cu/invar/Cu=1/3/1 to 3/1/3), each in the shape of a rolled sheet, an extruded sheet or an electrolytic sheet. If desired, the surface of the metallic base plate may be Ni-plated, Al-deposited, or Ag-plated to prevent corrosion due to oxidation or the like.

To obtain a package with good heat dissipation, it is desirable to form the base plate 4 from a material with a heat conductivity of 70 W/mK or more among the ceramics or metals, such as aluminum nitride, silicon carbide, beryllia, aluminum, aluminum alloy, copper, copper alloy, tungsten, molybdenum copper-tungsten alloy, copper-molybdenum alloy, or double-sided copper clad molybdenum. In case the base plate 4 is to be formed from a metal with a relatively high coefficient of thermal expansion, such as aluminum or copper, it is preferred to additionally bond a material with a coefficient of thermal expansion close to that of the semiconductor device 18, such as tungsten, molybdenum or aluminum nitride, via an adhesive layer, to that portion of the surface of the base plate 4 on which the semiconductor device 18 is to be mounted, i.e., the central portion on the top, and mount the semiconductor device 18 thereon, thereby lessening the difference in the coefficient of thermal expansion between the base plate 4 and the semiconductor device 18 (FIG. 2). The adhesive layer preferably has rubberlike elasticity as does the adhesive layer 6 to be described in detail later.

If desired, the base plate 4 may be formed of two or more kinds of plates bonded together via an adhesive layer. For instance, if an alumina plate with a coefficient of thermal expansion relatively close to that of the semiconductor device 18 is bonded to a copper plate with a high thermal conductivity via an adhesive layer, it is possible to form a desirable base plate 4 with a low coefficient of thermal expansion and a low thermal resistance. Such a base plate 4 has heat dissipation comparable to that of a base plate 4 formed of the above-mentioned material having a high thermal conductivity of 70 W/mK or more. The adhesive layer for use in bonding the alumina plate and the copper plate is preferably one having rubberlike elasticity as does the adhesive layer 6 to be described in detail later. The thickness of the adhesive layer is preferably 100 μm or less, particularly, 50 μm or less, in order to prevent a considerable reduction of heat dissipation. To improve the heat dissipation of the base plate 4, a filler composed of a material having a high thermal conductivity, such as silver, copper, or aluminum nitride, may be incorporated, where necessary, into the adhesive layer in an amount of, say, 20 to 90% by weight.

To impart sufficient mechanical strength to the package 2, it is important that the base plate 4 should have sufficient rigidity and not be easily deformed by stress produced therein. From this aspect, the base plate 4 preferably has a thickness of 0.2 mm or more, more preferably, 0.3 mm or more, although its thickness differs somewhat according to what material makes it. From the point of view of light weight and compactness, the thickness of the base plate 4 is preferably 3 mm or less.

The power layer 12 laminated onto the base plate 4 via the adhesive layer 6 (the adhesive layer 6 will be described in detail later). The power layer 12 is formed of a single member 20. The main part of the member 20 is a rectangular plate conforming to the base plate 4, and has a rectangular opening 22 formed at its center. At the outer peripheral portion of the member 20 are formed a multiplicity of outer leads 24 formed at suitable intervals. An outside portion of the outer lead 24, shaped like a ribbon, is connected to a so-called idle lead of a multiplicity of leads 26 in the signal layer 16 (the lead 26 of the signal layer 16 will be described in detail later). The connection between the outer lead 24 of the member 20 and the lead 26 of the signal layer 16 can be performed by a suitable means, such as electric spot welding, laser welding, ultrasonic bonding, thermocompression, pressure welding, brazing, soldering, or bonding with a conductive adhesive.

If desired, the power layer 12 may be formed of a single member or a plurality of members, in other shapes. For instance, the power layer 12 may be formed of a member having no opening formed at a center of the main part (in this case, the semiconductor device 18 is mounted on top of the power layer 12). To control the characteristic impedance and/or improve the adhesion, the main part of the member constituting the power layer 12 may be provided with many tiny holes. The total area of these tiny holes is advantageously 70% or less of the area of that portion of the member which contacts the adhesive layer 6.

The member 20 constituting the power layer 12 may be formed of a suitable conductive material. Preferably, it may be formed of a metal, such as copper, a copper alloy, aluminum, an aluminum alloy, an Fe-Ni-Co alloy (e.g., kovar), an Fe-Ni alloy (e.g., Alloy 42), single-sided or double-sided aluminum clad kovar (representative thickness of aluminum: 1 to 30 μm, representative composition of aluminum: 0.0 to 2.0 wt. % Si and the remainder being Al), single-sided or double-sided aluminum clad alloy 42 (representative thickness of aluminum: 1 to 30 μm, representative composition of aluminum: 0.0 to 2.0 wt. % Si and the remainder being Al), single-sided or double-sided aluminum clad copper (representative thickness of aluminum: 1 to 30 μm, representative composition of aluminum: 0.0 to 2.0 wt. % Si and the remainder being Al), single-sided or double-sided silver clad alloy 42 (representative thickness of silver: 1 to 30 μm), or single-sided or double-sided silver clad kovar (representative thickness of silver: 1 to 30 μm). The thickness of the member 20 is advantageously 5 to 300 μm in the light of machinability and ease of assembly.

Next, the adhesive layer 6 will be described which is interposed between the base plate 4 and the power layer 12 in order to bond the power layer 12 to the top of the base plate 4. In the present invention, it is important that the adhesive layer 6 has a modulus of elasticity (modulus in tension measured by the measuring method defined in JIS C 2321 and ASTM D-882) at 25° C. of 10 kg/mm$^2$ or less, and has rubberlike elasticity after being cured. Preferably, the modulus of elasticity at 25° C. of the adhesive layer 6 is 0.01 to 10 kg/mm$^2$, particularly, 0.03 to 5 kg/mm$^2$, and more particularly 0.05 to 2 kg/mm$^2$. The bond strength between the base plate 4 and the power layer 12, provided by the adhesive layer 6, is preferably 0.5 kg/cm or more, particularly 1 kg/cm or more, more particularly 1.5 kg/cm or more, most particularly 2 kg/cm or more, in terms of 90° peel strength (the force necessary to peel 1 cm wide power layer 12, bonded onto base plate 4 via adhesive layer 12, from the base plate 4 by pulling the power layer 12 in a direction of 90° with respect to the surface of the base plate 4, i.e., in the vertical direction). Since the modulus of elasticity at 25° C. of the adhesive layer 6 is 10 kg/mm$^2$ or less, a relative movement generated between the base plate 4 and the power layer 12 owing to the difference in the coefficient of thermal expansion between them is effectively buffered by the adhesive layer 6. Thus, the decrease in the bond strength due to thermal shock can be fully inhibited, and the package can be rendered fully durable. Furthermore, the adhesion of the adhesive layer 6 to the base plate 4 and the power layer 12 can be maintained properly, and the hermetic bond between the base plate 4 and the power layer 12 (the state of bonding in which no gas can pass through the junction between them) can be retained reliably. If the adhesive layer is formed from a relatively hard adhesive with a modulus of elasticity at 25° C. of more than 10 kg/cm, such as a polyimide adhesive in customary use, delamination may occur between the base plate 4 and the power layer 12 under thermal shock. As a result, a warp may develop in the entire package 2 including the base plate 4, or the hermetic bond between the base plate 4 and the power layer 12 may be damaged. The bond strength between the base plate 4 and the power layer 12 should desirably be as high as possible. According to our experience, when the 90° peel strength is 0.5 kg/cm or more, the delamination or the destruction of the hermetic bond can be prevented reliably. The planar shape of the adhesive layer 6 is preferably substantially the same as that of the main part of the member 20 constituting the power layer 12 (the part excluding the outer leads 24).

Preferred examples of the adhesive constituting the adhesive layer 6 are silicone rubber adhesives and fluororubber adhesives which have excellent thermal stability. The preferred silicone adhesives are liquids, pastes, or solutions in organic solvents, prepared by mixing suitable amounts of adhesiveness imparting agents, such as crosslinking agents or silane coupling agents, with silicone oils consisting essentially of silanes or organopolysiloxanes (silicones). The preferred fluororubber adhesives are liquids, pastes, or solutions in organic solvents, consisting essentially of copolymers mainly composed of hexafluoropropylenevinylidene fluoride.

The silicone rubber adhesive, when cured, becomes a rubberlike elastic member having adhesiveness. Among the silicone rubber adhesives are those which are cured by a condensation reaction going on upon reaction with moisture in the atmosphere at room temperature; those which are cured by dimethylene crosslinking following an addition reaction proceeding upon heating, or without heating, in the presence of a catalyst, such as platinum, as in the case of silicone oils containing SiH groups and vinyl groups; and those which are cured under exposure to ultraviolet light. Other types are also available, such as a one-component type which requires no mixing with a curing agent when curing, and a two-component type which requires mixing with a curing agent when curing. The adhesive of a thermosetting type which is crosslinked by addition reaction can be used preferably, since it is substantially free from by-products when cured and its curing time is short.

To the adhesive constituting the adhesive layer 6 can be added a filler which affects the viscosity and thixotropy of the adhesive. The addition of such a filler can prevent the squeeze-out of the adhesive effectively, and improve the accuracy of application of the adhesive. Various fillers having insulating properties, e.g., inorganic oxides such as alumina, silica, titanium oxide, zinc oxide, beryllium oxide or calcium oxide, inorganic non-oxides such as silicon nitride, silicon carbide, aluminum nitride or boron nitride, and organic polymers such as epoxy resins, acrylic resin or fluororesins, may be used singly or in combination of two or more. The size of the filler, as the average particle diameter, is preferably 0.1 to 100 μm, particularly 0.3 to 30 μm. The shape of the filler may be spherical, acicular or branched. The amount of the filler incorporated is preferably 1 to 80% by weight, particularly 5 to 70% by weight, more particularly 10 to 35% by weight, based on the entire adhesive containing the filler. The addition of the filler in this amount can adjust the viscosity of the adhesive in the uncured state to the range of from 50 to 1000 Pa's. Thus, the amount of the adhesive squeezed out of a desired flat shape can be kept to 0.5 mm or less, and adequate bond strength can be obtained. The atmosphere present when the power layer 12 is bonded to the base plate 4 via the adhesive layer 6 may be the air. If the power layer 12 is oxidizable, however, the preferred atmosphere is a non-oxidizing atmosphere substantially free from oxygen, especially, a non-oxidizing atmosphere under reduced pressure to vacuum. In case the bonding is performed in the atmosphere under reduced pressure to vacuum, air bubbles in the adhesive can be removed, and the bond strength enhanced. The thickness of the adhesive layer 6 is preferably 0.005 to 3 mm. Too small a thickness of the adhesive layer 6 would make it difficult to obtain adequate bond strength and to achieve a hermetic bond between the base plate 4 and the power layer 12. Too large a thickness of the adhesive layer 6, on the other hand, would render the entire package excessively thick.

By forming a specific adhesive layer 6 as described above, our experiments have demonstrated, a required, highly reliable bond can be achieved in any of the following cases:

(a) The base plate 4 and the power layer 12 to be bonded by the adhesive layer 6 are formed of the same kind of material (e.g., the base plate 4 is formed of aluminum or an aluminum alloy, and the power layer 12 is formed of aluminum or an aluminum alloy);

(b) The difference in the coefficient of thermal expansion at 0° to 100° C. between the base plate 4 and the power layer 12 to be bonded by the adhesive layer 6 is about $5 \times 10^{-6+}$ °C$^{-1}$, a relatively small difference (e.g., the base plate 4 is formed of molybdenum, tungsten, aluminum nitride ceramic or alumina ceramic, and the power layer 12 is formed of alloy 42, kovar or molybdenum); and (c) The difference in the coefficient of thermal expansion at 0° to 100° C. between the base plate 4 and the power layer 12 to be bonded by the adhesive layer 6 is about $14-30 \times 10^{-6+}$°C$^{-1}$, a relatively great difference (e.g., the base plate 4 is formed of aluminum nitride ceramic or alumina ceramic, and the power layer 12 is formed of aluminum or aluminum alloy; or the base plate 4 is formed of silicon carbide or aluminum nitride ceramic, and the power layer 12 is formed of aluminum, lead or zinc).

With reference to FIGS. 1 and 2, the ground layer 14 is laminated onto the power layer 12 via the adhesive layer 8. Such ground layer 14 is also formed of a single member 28, like the power layer 12. The main part of the member 28 is a rectangular plate conforming to the main part of the power layer 12, and has a rectangular opening 30 formed at its center. At the outer peripheral portion of the member 28 are formed a multiplicity of outer leads 32 formed at suitable intervals. Each of the outer leads 32 is disposed so as to be offset relative to the outer leads 24 of the power layer 12. An outside portion of the outer lead 32, shaped like a ribbon, is connected to a so-called idle lead of a multiplicity of leads 26 in the signal layer 16 (the leads 26 of the signal layer 16 will be described in detail later). The connection between the outer lead 32 of the member 28 and the lead 26 of the signal layer 16 can be performed by a suitable means, such as electric spot welding, laser welding, ultrasonic bonding, thermocompression, pressure welding, brazing, soldering, or bonding with a conductive adhesive.

If desired, the ground layer 14 may be formed of a single member or a plurality of members, in other shapes. For instance, in order to control the characteristic impedance and/or improve the adhesion, the main part of the member constituting the ground layer 14 may be provided with many tiny holes. The total area of these tiny holes is advantageously 70% or less of the area of that portion of the member which contacts the adhesive layer 8. The preferred materials for the member 28 constituting the ground layer 14 may be the same as the preferred materials for the member 20 constituting the power layer 12.

The adhesive layer 8 to be interposed between the power layer 12 and the ground layer 14 may be formed of the adhesive hitherto used in a package for mounting a semiconductor device, such as a polyimide adhesive, an epoxy adhesive or an acrylic adhesive, or any other suitable adhesive. Preferably, it is formed of an adhesive which has rubberlike elasticity after being cured, as is the adhesive layer 6 interposed between the base plate 4 and the power layer 12. The planar shape of the adhesive layer 8 is preferably substantially the same as the planar shape of the main part of the member 28 constituting the ground layer 14 (the part excluding the outer leads 32), accordingly, substantially the same as the planar shape of the main part of the member 20 constituting the power layer 12.

In the embodiment illustrated in FIGS. 1 and 2, the power layer 12 is laminated onto the top of the base plate 4 via the adhesive layer 6, and the ground layer 14 is laminated onto the top of the power layer 12 via the adhesive layer 8. If desired, the ground layer may be laminated onto the top of the base plate via the adhesive layer, and the power layer may be laminated onto the top of the ground layer via the adhesive layer. In this case, it is important that the adhesive layer interposed between the base plate and the ground layer be formed of an adhesive which has rubberlike elasticity after being cured,. as is the adhesive layer 6. The adhesive layer interposed between the ground layer and the power layer may be formed of a suitable adhesive, but preferably, it is likewise formed of an adhesive which has rubberlike elasticity after being cured.

Further with reference to FIGS. 1 and 2, the signal layer 16 is laminated onto the ground layer 14 via the adhesive layer 10. The signal layer 16 in the illustrated embodiment is formed of a multiplicity of ribbonlike leads (so-called lead frame) 26. The multiple leads 26 are disposed at intervals so as to form a predetermined pattern. As is well known in the art, one piece having the many leads 26, and a rectangular outer ring (so-called tie-bar) connecting the outside ends of the leads 26 is bonded to the top of the ground layer 14 via the adhesive layer 10. Then, the outer ring is cut off the outside ends of the leads 26, thereby achieving a state in which the many leads 26 are bonded onto the ground layer 14 via the adhesive layer 10. An outside portion of the lead 26 (i.e., the outer lead) is bent. Such bending can be carried out in a manner well known in the art after the leads 26 are bonded onto the ground layer 14 via the adhesive layer 10.

If desired, the signal layer 16 may be formed of a single member or a plurality of members, in other shapes. The preferred materials for the lead 26 constituting the signal layer 16 may be the same as the preferred materials for the member 20 constituting the power layer 12. The adhesive layer 10 to be interposed between the ground layer 14 and the signal layer 16 may be formed of the adhesive hitherto used in a package for mounting a semiconductor device, such as a polyimide adhesive, an epoxy adhesive or an acrylic adhesive, or any other suitable adhesive, as is the adhesive layer 8 to be interposed between the power layer 12 and the ground layer 14. Preferably, it is formed of an adhesive which has rubberlike elasticity after being cured, as is the adhesive layer 6 interposed between the base plate 4 and the power layer 12. The planar shape of the adhesive layer 10 is preferably substantially the same as the planar shape of the main part of the member 28 constituting the ground layer 14 (the part excluding the outer leads 32).

As will be seen clearly by reference to FIG. 2, a cavity open upwards, i.e., a cavity for mounting a semiconductor device, is defined at a central portion of the package 2 describe above. The bottom surface of such a cavity is defined by the top of the base plate 4, and the four side surfaces thereof are defined by the inside end surfaces of the adhesive layer 6, the power layer 12, the adhesive layer 8, the ground layer 14, the adhesive layer 10, and the signal layer 16. In the cavity is mounted the semiconductor device 18, which is connected to the power layer 12, the ground layer 14 and the signal layer 16 by bonding wires 34. If desired, a cap (not shown) is bonded to the package 2 in an inert gas atmosphere or in vacuum to seal the cavity where the semiconductor device has been mounted. The way of mounting the semiconductor device 18, the way of bonding it by the bonding wires (wire bonding), and the way of sealing it with the cap are well known to those skilled in the art, and their detailed descriptions are omitted herein. If desired, bump bonding or tape automated bonding may be used in place of the bonding by the bonding wires 34.

The following facts should also be noted in regard to the package 2 for mounting the semiconductor device that has been described with reference to FIGS. 1 and 2: The power layer 12 and the ground layer 14 are formed of the platelike members 20 and 28 having relatively large areas, so that the self inductances of the power layer 12 and the ground layer 14 are relatively small. In addition, a decoupling capacitor with a capacity of about 50 to 1000 pF is formed between the power layer 12 and the ground layer 14. Thus, a noise to be generated in the power layer 12 and the ground layer 14 can be fully suppressed. The self inductances of the power layer 12 and the ground layer 14 are each 0.1 to 0.6 nH (frequency: 1 MHz or more) when the members 20 and 28 are each formed of a metal plate having a thickness of 0.1 mm, being a 40×40 mm square excluding the outer leads 24 and 32, and having a 20×20 mm square opening formed at the center; or they are each 0.05 to 0.3 nH (frequency: 1 MHz or more) when the members 20 and 28 are each formed of a metal plate having a thickness of 0.1 mm, being a 40×40 mm square excluding the outer leads 24 and 32, and having no opening formed at the center.

Figure 3:
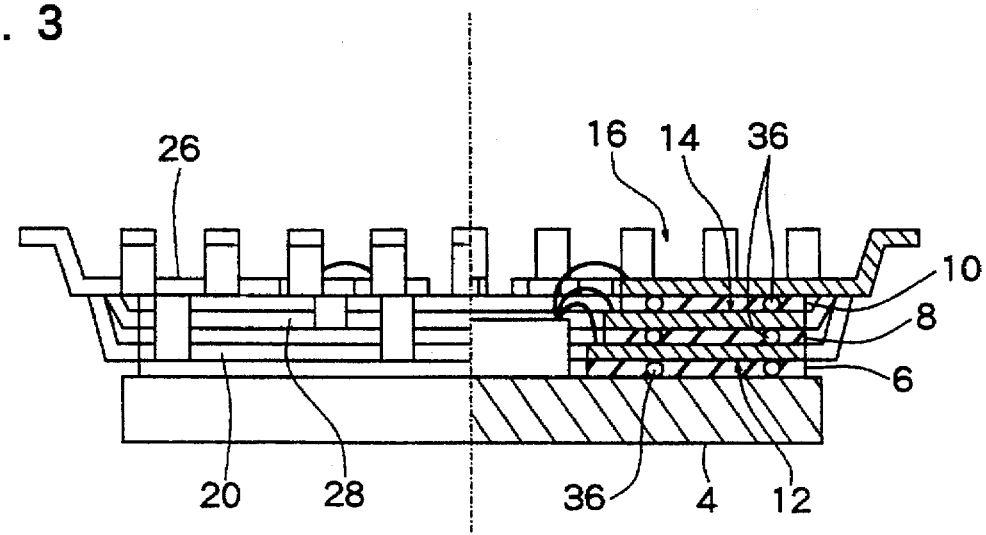
FIG. 3 is a front view, partly in cross section, of a modified example of the package shown in FIGS. 1 and 2.

FIG. 3 shows a modified example of the package for mounting a semiconductor device illustrated in FIGS. 1 and 2. In this modified example, spacer means 36 are arranged in the adhesive layers 6, 8 and 10. The spacer means 36 is formed of a plurality of spheres incorporated into the adhesives for forming the adhesive layers 6, 8 and 10 before the adhesives are cured. The diameters of these spheres are conformed to the desired thicknesses of the adhesive layers 6, 8 and 10, accordingly, the desired values of the distance between the base plate 4 and the power layer 12, the distance between the power layer 12 and the ground layer 14, and the distance between the ground layer 14 and the signal layer 16. The material for the sphere constituting the spacer means 36 is preferably the one described earlier as the preferred material for the filler that can be added to the adhesive which forms the adhesive layer 6. When such spacer means 36 are disposed in the adhesive layers 6, 8 and 10, the thicknesses of the adhesive layers 6, 8 and 10 are defined sufficiently precisely by the diameters of the spheres constituting the spacer means 36. This prevents fluctuations or unevennesses of the thicknesses of the adhesive layers 6, 8 and 10 that would otherwise occur depending on the pressure exerted during lamination. If desired, before the power layer 12, the ground layer 14 and the signal layer 16 are laminated in this sequence onto the base plate 4, a plurality of projections or ridges constituting the spacer means can be formed beforehand at predetermined surfaces of the member 20 constituting the power layer 12, the member 28 constituting the ground layer 14, and the leads 26 constituting the signal layer 16. The constitution of the modified example of FIG. 3, excluding the spacer means 36, is substantially the same as in the embodiment shown in FIGS. 1 and 2.

Figure 4:
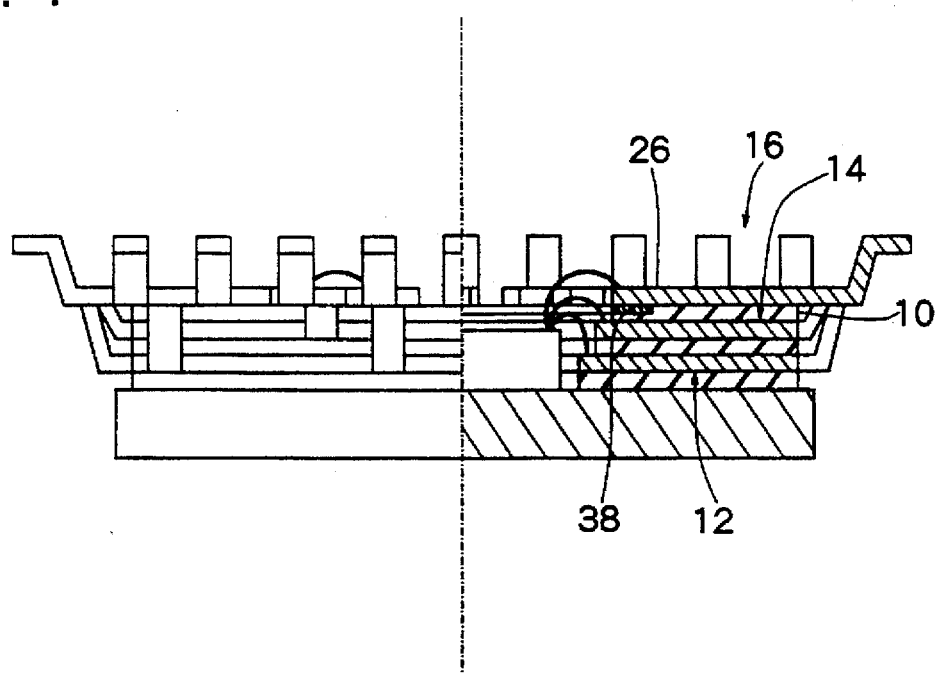
FIG. 4 is a front view, partly in cross section, of another modified example of the package shown in FIGS. 1 and 2.

FIG. 4 shows another modified example of the package for mounting a semiconductor device illustrated in FIGS. 1 and 2. In this modified example, an insulating hard resin layer 38 is disposed on the inner surface (the underside of the inside portion) of the inner lead of each of the multiple leads 26 constituting the signal layer 16. The preferred insulating hard resin layer has a modulus of elasticity of 10 to 10000 kg/mm². Examples of the preferred insulating hard resin layer are polyimide resins, epoxy resins, fluororesins, acrylic resins, and phenolic resins. The thickness of the resin layer 38 is somewhat smaller than the distance between the ground layer 14 and the signal layer 16, and preferably, it is, say, about 0.05 to 0.7 mm, particularly 0.1 to 0.5 mm. It is also preferred that the adhesive layer 10 is caused to remain in a slight thickness between the resin layer 38 and the ground layer 14. The resin layer 38 may be a rectangular smooth film or sheet. If desired, it is permissible to use a film or sheet having numerous holes about 0.05 to 0.5 mm in diameter, and allow the adhesive forming the adhesive layer 10 to move into the numerous holes. Before the signal layer 16 is laminated onto the ground layer 14 via the adhesive layer 10, the resin layer 38 can be bonded by a suitable method, such as thermocompression, at a required site of the underside of the leads 26 constituting the signal layer 16. Alternatively, when the adhesive for forming the adhesive layer 10 is in the uncured state, the resin layer 38 is embedded at a required site of the adhesive, and then the leads 26 are laminated onto the uncured adhesive, whereby the resin layer 38 can be positioned at the required site of the underside of the leads 26.

When the leads 26 constituting the signal layer 16 and the semiconductor device 18 are connected by bonding wires, one end of the bonding wire needs to be fixed on the upper surface of the inner lead of the lead 26. Such fixing is performed advantageously by so-called ultrasonic wire bonding known per se which utilizes pressure and ultrasonic vibrations. According to our experience, if the adhesive layer 10 present below the signal layer 16 has rubberlike elasticity, the adhesive layer 10 is elastically compressed by the pressure exerted on the inner leads during ultrasonic wire bonding. Consequently, the inner leads are displaced slightly downwardly, making the bonding operation difficult, and relatively great ultrasonic output is required. However, if the insulating hard resin layer 38 is disposed at the inside portion of the underside of the inner leads as in the modified example shown in FIG. 4, the downward displacement of the inner leads during ultrasonic wire bonding is thoroughly prevented, and the ultrasonic output required can be considerably reduced.

Figure 5:
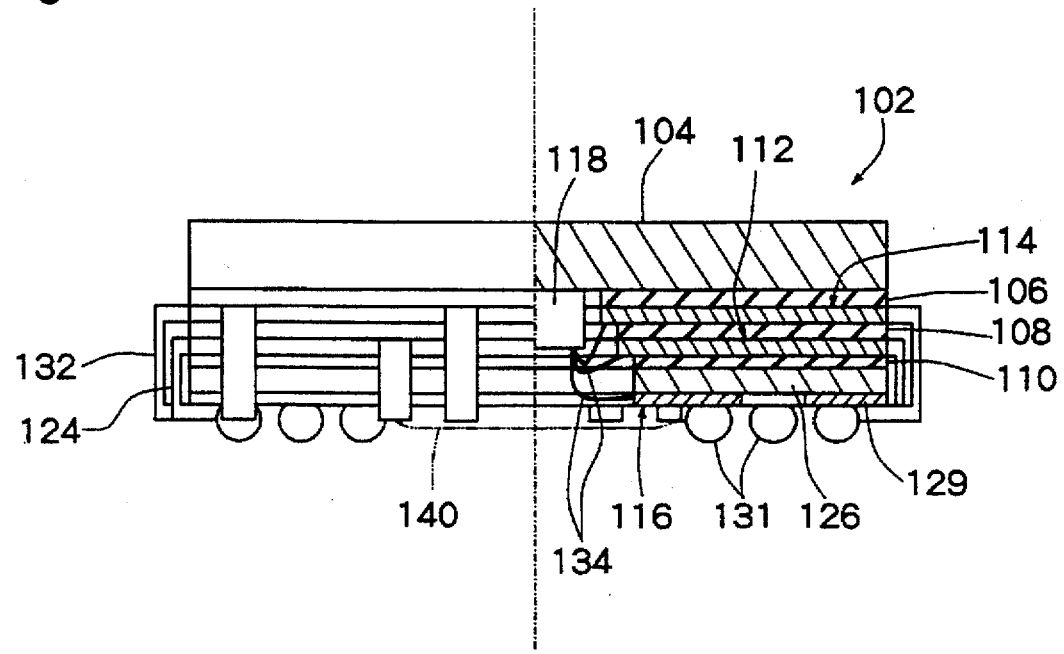
FIG. 5 is a front view, partly in cross section, of another preferred embodiment of a package for mounting a semiconductor device in accordance with the present invention.

FIG. 5 shows another preferred embodiment of a package for mounting a semiconductor device in accordance with the present invention. A package shown generally at the numeral 102 has a base plate 104, and three conductive layers, i.e., a ground layer 114, a power layer 112 and a signal layer 116, laminated on the underside of the base plate 104 via adhesive layers 106, 108 and 110, respectively, interposed between the adjacent layers.

The signal layer 116 in the package 102 illustrated in FIG. 5 is composed of a circuit substrate 126. The circuit substrate 126, which may be of a shape well known, has a main part shaped like a rectangular plate. At the center of the main part is formed a rectangular opening. One surface of the main part of the circuit substrate 126, namely, its underside, is provided with a required circuit pattern 129, which is further equipped with many outer connecting terminals 131. The many outer connecting terminals 131 are composed of a so-called ball grid array. The circuit substrate 126 constituting the signal layer 116 will be described in detail herein. The main part of the circuit substrate 126 may be formed of, say, a ceramic such as alumina or aluminum nitride, a plastic such as epoxy resin, phenolic resin or fluororesin, glass, or a composite of these. If the main part of the circuit substrate 126 is formed of a ceramic, the circuit pattern 129 can be formed by printing a paste containing a powder of conductive metal, such as copper or silver, on the main part and curing it, or printing a paste containing a high melting point metal on the main part, and then sintering it to form a metallized layer. If the main part of the circuit substrate 126 is formed of a plastic, the circuit pattern 129 can be formed by applying a copper foil on one surface of the main part, and etching the copper foil. The ball grid array constituting the many outer connecting terminals 131 can be formed of a low melting point conductive substance such as solder. The many outer connecting terminals can be formed of a pin grid array well known in the art, which includes many pins formed of a metal such as copper, alloy 42 or kovar, instead of the ball grid array.

The ground layer 114 has, integrally formed therewith, outer leads 132 which constitute connecting means for electrically connecting the ground layer 114 to the outer connecting terminals 131. The outer leads 132 are a ribbonlike shape extend downwardly along the side surface of the package 102, and then extending inwardly to be connected to the outer connecting terminals 131. Similarly, the power layer 112 has, integrally formed therewith, outer leads 124 which constitute connecting means for electrically connecting the power layer 112 to the outer connecting terminals 131. The outer leads 124 are also of a ribbonlike shape, extend downwardly along the side surface of the package 102, and then extend inwardly to be connected to the outer connecting terminals 131.

In the package 102 illustrated in FIG. 5, a cavity for mounting a semiconductor device 118 is defined below the base plate 104, and the semiconductor device 118 is mounted at the center of the underside of the base plate 104. The semiconductor device 118 is connected to the power layer 112, the ground layer 114 and the signal layer 116 by bonding wires 134. Then, if desired, a suitable resin, such as epoxy resin, may be poured into the cavity where the semiconductor device 118 is mounted, whereby the semiconductor device 118 can be sealed, as shown by a two-dot chain line 140 in FIG. 5. Except the above-described constitution, the structure of the package 102 illustrated in FIG. 5 (e.g., the materials for the base plate 104, the adhesive layers 106, 108 and 110, the power layer 112 and the ground layer 114) may be substantially the same as for the package 2 of FIGS. 1 and 2.

In connection with the package 102 of FIG. 5, the following facts should be given attention: in a package having many outer connecting terminals, such as ball grid array or pin grid array, formed on the underside or top of the package, it has been customary practice that the connecting means for electrically connecting the power layer and the ground layer to the outer connecting terminals are composed of a conductive metal plating applied in through-holes formed in a laminated structure constituting the package. With such a conventional package, if the outer connecting terminals are densely arranged, the diameter of the through-holes is markedly small, and thus the inductance of the connecting means is large. Hence, a considerably large noise is generated during high speed operation of the semiconductor device, thereby increasing the risk for malfunctions.

In the package 102 of FIG. 5, on the other hand, the connecting means for connecting the power layer 112 and the ground layer 114 to the outer connecting terminals 131 are composed of the outer leads 124 and 132 extending along the side surface of the package 102. The outer leads 124 and 132, if considerably increased in numbers, can be formed into shapes of a relative large cross sectional area, and their inductances can be maintained low. Thus, noise generation during high speed operation of the semiconductor device 118 can be fully suppressed. In addition, the numbers and positions of the outer leads 124 and 132 between the power layer 112 and ground layer 114 and the outer connecting terminals 131 can be arbitrarily chosen, so that the ground inductance and the power inductance can be adjusted suitably. The positions of the outer leads 124 and 132, in particular, determine the inlets and outlets of current that greatly affect the current distribution of the power layer 112 and the ground layer 114 and considerably change the inductances. Hence, the possibility for arbitrarily selecting the positions of the outer leads 124 and 132 brings great advantage to the design of the semiconductor device. In the embodiment of FIG. 5, the connecting means are composed of the outer leads 124 and 132 formed integrally with the power layer 112 and the ground layer 114, but they may be composed of a conducting means of other suitable shapes extending along the side surface of the package 102, e.g., a conducting line formed of a conductive paste. The total inductance of the power layer 112 and the total inductance of the ground layer 114 are desirably 1 nH or less, particularly, 0.5 nH or less.

Figure 6:
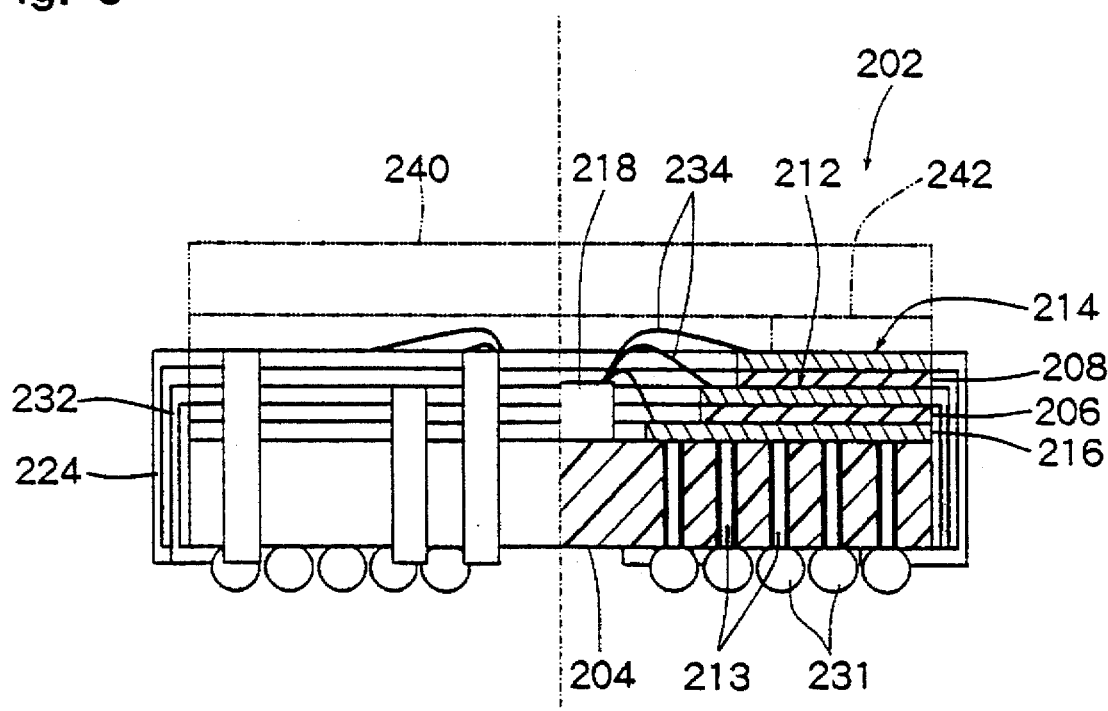
FIG. 6 is a front view, partly in cross section, of still another preferred embodiment of a package for mounting a semiconductor device in accordance with the present invention.

FIG. 6 shows still another preferred embodiment of a package for mounting a semiconductor device in accordance with the present invention. A package shown generally at the numeral 202 has a base plate 204. The base plate 204, optionally in the shape of a rectangular plate, may be formed of a plastic such as epoxy resin, phenolic resin or fluororesin, a ceramic such as alumina or aluminum nitride, glass, or a composite of these. On the underside of the base plate 204 are formed many outer connecting terminals 231 composed of a ball grid array. The ball grid array can be formed of a low melting point conductive substance such as solder. The many outer connecting terminals can be composed of a pin grid array, including many pins formed of a metal such as copper, alloy 42 or kovar, instead of the ball grid array. On the other surface, or the top, of the base plate 204 is formed a signal layer 216. If the base plate 204 is formed of a plastic, the signal layer 216 can be formed by applying a copper sheet thereon, and etching the copper sheet. If the base plate 204 is formed of a ceramic, the signal layer 216 can be formed by printing a paste containing a powder of conductive metal, such as copper or silver, on the base plate 204 and curing it, or printing a paste containing a high melting point metal on the base plate 204, and then sintering it to form a metallized layer. As will be seen clearly by reference to FIG. 6, there is no signal layer 216 at the center of the upper surface of the base plate 204, and instead a rectangular region for mounting a semiconductor device is left there. In the base plate 204 are formed many through-holes 213, which are plated with a conductive metal. These platings connect the signal layer 216 to the outer connecting terminals 231.

On the signal layer 216 integrally formed on the top of the base plate 204 is laminated a power layer 212 via an adhesive layer 206, and a ground layer 214 is further laminated thereon via an adhesive layer 208. As with the package 102 of FIG. 5, the power layer 212 has, integrally formed therewith, outer leads 224 which constitute connecting means for electrically connecting the power layer 212 to the outer connecting terminals 231. The outer leads 224 are of a ribbonlike shape, extend downwardly along the side surface of the package 202, and then extend inwardly to be connected to the outer connecting terminals 231. Similarly, the ground layer 214 has, integrally formed therewith, outer leads 232 which constitute connecting means for electrically connecting the ground layer 214 to the outer connecting terminals 231. The outer leads 232 are also of a ribbonlike shape, extend downwardly along the side surface of the package 202, and then extend inwardly to be connected to the outer connecting terminals 231. At the center of the adhesive layer 206, the power layer 212, the adhesive layer 208 and the ground layer 214 is formed a rectangular opening which defines a cavity for mounting a semiconductor device. A semiconductor device 218 is mounted at the center of the top of the base plate 204. Such semiconductor device 218 is connected to the power layer 212, the ground layer 214 and the signal layer 216 by bonding wires 234. If desired, as shown by a two-dot chain line in FIG. 6, a cap 240 is bonded onto the top of the ground layer 214 via a suitable adhesive layer 242 in an inert gas atmosphere or in vacuum. As a result, the bottom surface of the cavity where the semiconductor device 218 is mounted is closed, whereby the semiconductor device 218 can be sealed. The cap 240, optionally in the shape of a rectangular plate, may be formed of a ceramic or plastic. Except the above-described constitution, the structure of the package 202 illustrated in FIG. 6 (e.g., the materials for the adhesive layers 204 and 206, the power layer 212 and the ground layer 214) may be substantially the same as for the package 2 of FIGS. 1 and 2.

Next, examples and comparative examples will be described, but the present invention is in no way limited to these examples.

The First Examples and Comparative Examples

Silicone resin adhesives (Examples), epoxy resin adhesives (Comparative Examples), and polyimide resin adhesives (Comparative Examples) as shown in Table 1 were each chosen as the adhesive for forming the adhesive layer between the base plate and the conductive layer.

25° C. was measured as the modulus in tension by the method of JIS C2321 for the silicone resin adhesives and by the method of ASTM D-882 for the other resin adhesives. The results are shown in Table 1.

The epoxy resin adhesives used were two types, one cured after mixing of the two components, and the other containing a curing agent and capable of B stage (semi-curing). The polyimide resin adhesives used were two kinds, an aromatic polyimide precursor solution of a heat curing type which is applied and then heat-cured, and a thermoplastic adhesive called Oram (Mitsui Toatsu Chemicals, Inc.). The silicone resin adhesives used were a total of five kinds of adhesives, two one-component room temperature curing adhesives A and B (called RTV rubber) different in adhesiveness, and three one-component heat curing organopolysiloxanes A, B and C different in adhesiveness and modulus of elasticity which contain SiH groups and vinyl groups, and which are each heated together with a chloroplatinic acid catalyst to undergo the addition reaction and form dimethylene crosslinks, resulting in curing. Of these silicone resin adhesives, the heat curing type A relying on addition reaction contains as the only filler 25% by weight of silica having purity of 99.99% or more and an average particle diameter of 4.5 μμm. The heat curing type B contains 50% by weight of alumina having purity of 99.99% or more and an average particle diameter of 0.6 μm, and 20% by weight of silica. The heat curing type C contains 25% by weight of alumina and 20% by weight of silica.

The silicone resin adhesives used all had a modulus of elasticity of 10 kg/mm$^2$ or less, showing rubberlike elasticity.

Then, a plate of a copper-tungsten alloy containing molybdenum, tungsten and Cu in an amount of 10% by weight, double-sided Al clad kovar (Al thickness: 8 μm on each side), double-sided Al clad copper (Al thickness: 8 μm on each side), aluminum or copper was used as the metallic base plate. As the ceramic base plate was used a plate of alumina or aluminum nitride ceramic. These base plates were each a 40×40 mm square plate 1 mm in thickness. The conductive layer prepared was a layer of copper, aluminum, alloy 42, kovar, zinc, molybdenum, KV-15 (Fe-Ni-Co alloy of Sumitomo Special Metals Co., Ltd., having a coefficient of thermal expansion, at room temperature to up to 350° C.,

TABLE 1

| Type | | Adhesive | Bonding conditions | | | | | Modulus of elasticity of curing product of adhesive (kg/mm$^2$) |
|---|---|---|---|---|---|---|---|---|
| | | | Coating thickness (μm) | Heating temp. (°C.) | Heating time (hr) | Atmosphere | Load (g/cm$^2$) | |
| A | Epoxy resin | Two component mixing type | 100 | 177 | 3 | $N_2$ | 70 | 810 |
| B | | B stage type | 100 | 150 | 3 | In the air | 70 | 340 |
| C | Polyimide | Thermosetting type | 100 | 440 | 0.5 | $N_2$ | 20 | 910 |
| D | resin | Thermoplastic type | 100 | 410 | 0.1 | $N_2$ | 20 | 290 |
| E | Silicone | Room temp. curing type A | 100 | 25 | 120 | In the air | 0 | 0.07 |
| F | resin | Heat curing type A | 100 | 150 | 1 | In the air | 0 | 0.16 |
| G | | | 100 | 150 | 1 | Under reduced pressure | 0 | 0.20 |
| H | | Heat curing type B | 100 | 150 | 1 | In the air | 0 | 1.6 |
| I | | Room temp. curing type B | 100 | 25 | 120 | In the air | 0 | 0.03 |
| J | | Heat curing type C | 100 | 150 | 1 | In the air | 0 | 0.21 |

First, these resin adhesives were measured for the modulus of elasticity at 25° C. The curing products of the adhesives were prepared under the heating conditions and atmospheres shown in Table 1. The modulus of elasticity at close to that of aluminum nitride or silicon semiconductor), double-sided Al clad alloy 42 (Al thickness: 8 μm on each side), double-sided Al clad kovar (Al thickness: 8 μm on each side), or double-sided Al clad copper (Al thickness: 8

μm on each side), each layer having a total thickness of 0.1 mm. The power layer prepared was a 39×39 mm square plate having a 20×20 mm square opening at the center. The ground layer prepared was a 39×39 mm square plate having a 22×22 mm square opening at the center.

The above base plate and power layer, in the combination shown in Table 2, were laminated together via the above adhesive (coating thickness 100 μm). Onto the power layer was laminated the ground layer of the same material via the adhesive (coating thickness 100 μm). Onto the ground layer was further laminated the signal layer of the material shown in Table 2 via the adhesive (coating thickness 100 μm). The laminate was subjected to bonding under the conditions shown in Table 1 to constitute a package for mounting a semiconductor device. The signal layer was a single layer having 304 leads, an outer lead pitch of 0.5 mm, and a thickness of 0.15 mm.

In bonding the copper base plate and the power layer, the atmosphere used was nitrogen, if the heating temperature exceeded 150° C. Of the silicone resin adhesives, those of the heat curing type and having a low modulus of elasticity were used, there was no decrease in the hermeticity. When the epoxy resin or polyimide resin adhesives were used, the hermeticity declined to $1\times10^{-5}$ atm.cc/sec.

The hermeticity test using the helium leak method was performed by placing a silicone grease-coated silicone rubber cap on top of the signal layer of the package of the shape shown in FIG. 1, evacuating the cavity, where a semiconductor device was to be mounted, by means of a vacuum pump (a diffusion pump), blowing helium gas from around the cap, and reading changes in the degree of helium leak amount inside the cavity.

To measure the bond strength between the base plate and the power layer, the power layer bonded onto the base plate was cut to a width of 3 mm. Three of the cut pieces were pulled at a rate of 40 mm/min in a direction of 90° relative to the bonded surface of the base plate. The average of the maximum tensile strengths of these three leads was calculated as the 90° peel strength. The results are shown in Table 2.

TABLE 2

| | | Power layer | | Type of | | Bond strength (kg/cm) | | | |
| | | | | | | | | After PCT | |
| No. | Base Plate | Ground layer | Signal layer | adhesive | Initial | After thermal shock test | After dip-soldering test | 100 h | 500 h |
| --- | --- | --- | --- | --- | --- | --- | --- | --- | --- |
| 1* | Aluminum | Cu | Cu | A | 3.4 | Peeled | Peeled | 0.6 | —** |
| 2* | nitride | | | B | 2.8 | Peeled | 1.1 | 0.7 | — |
| 3* | | | | C | 3.3 | Peeled | Peeled | 0.3 | — |
| 4* | | | | D | 3.7 | Peeled | 1.3 | 0.2 | — |
| 5 | | | | E | 3.6 | 3.3 | 3.6 | 3.5 | — |
| 6 | | | | G | 5.1 | 5.0 | 5.2 | 4.9 | 0.7 |
| 7 | | | | H | 4.3 | 4.5 | 4.5 | 4.6 | — |
| 8 | | Kovar | Alloy 42 | F | 5.1 | 5.0 | 5.1 | 5.2 | 0.8 |
| 9 | | Al | Alloy 42 | F | 4.9 | 5.3 | 5.0 | 4.9 | — |
| 10 | | Al clad alloy 42 | Alloy 42 | G | 4.9 | 4.9 | 5.0 | 5.0 | 1.2 |
| 11 | | Zn | Alloy 42 | G | 5.0 | 4.9 | 5.4 | 5.1 | — |
| 12 | Alumina | Alloy 42 | Alloy 42 | F | 4.6 | 4.9 | 4.9 | 4.7 | — |
| 13 | Al | KV - 15 | Alloy 42 | F | 5.0 | 5.4 | 5.2 | 5.1 | — |
| 14 | Cu | Mo | Alloy 42 | F | 4.7 | 5.0 | 5.4 | 4.9 | — |
| 15 | Molybdenum | Cu | Cu | J | 3.9 | 3.9 | 4.2 | 3.8 | — |
| 16 | | Al clad alloy 42 | Alloy 42 | J | 4.1 | 4.0 | 4.0 | 4.3 | 4.0 |
| 17 | | Kovar | Alloy 42 | J | 4.1 | 3.8 | 4.3 | 4.3 | 3.9 |
| 18 | Tungsten | Al clad kovar | Alloy 42 | J | 3.8 | 3.9 | 4.1 | 3.9 | — |
| 19 | Copper-tungsten | Cu | Cu | J | 3.6 | 3.4 | 3.5 | 3.7 | — |
| 20 | | Al clad alloy 42 | Alloy 42 | J | 3.9 | 3.8 | 4.3 | 3.8 | 3.7 |
| 21 | Aluminum | Cu | Cu | J | 0.8 | 0.8 | 0.8 | 0.7 | 0.6 |
| 22 | nitride | Cu | Cu | J | 3.7 | 3.3 | 3.7 | 3.7 | 3.5 |
| 23 | | Al clad alloy 42 | Alloy 42 | J | 4.2 | 4.2 | 4.5 | 4.3 | 4.0 |
| 24 | | Kovar | Alloy 42 | J | 4.0 | 3.8 | 4.4 | 3.9 | 3.6 |
| 25 | Al clad kovar | Al clad alloy 42 | Alloy 42 | J | 4.1 | 4.0 | 4.5 | 4.0 | 3.8 |
| 26 | | Cu | Cu | J | 3.8 | 3.8 | 4.0 | 3.5 | — |
| 27 | AlN | Al clad copper | Alloy 42 | J | 3.9 | 4.0 | 4.3 | 3.8 | 3.5 |
| 28 | | Al clad copper | Cu | J | 4.0 | 4.3 | 4.8 | 4.0 | — |

*Nos. 1 to 4 represent the Comparative Examples.
**The symbol [—] represents that the bond strength was not measured.

(Nos. 6, 10, 11), however, were involved in bonding in the air or under reduced pressure of $1\times10^{-3}$ Torr.

The resulting packages were each tested for sealing properties or hermeticity. Initially, they showed helium leaks of $1\times10^{-6}$ atm.cc/sec or less, representing satisfactory hermeticity. Then, they were subjected to a thermal shock test (a test involving heating at 150° C. for 10 minutes and cooling at −65° C. for 10 minutes) conducted 1,000 times; a dip-soldering test (260° C. for 5 seconds) conducted 5 times; and a pressure cooker test (PCT) conducted for 100 hours at 121° C. and 2 atmospheric pressure in saturated steam. When the silicone resin adhesives (the Examples)

The packages of test Nos. 6, 8, 10, 16, 17, 20–24, 25 and 27 were further examined for the bond strength and the hermeticity by the helium leak method after 500 hours of the PCT. The packages of Nos. 6, 8 and 10 were markedly decreased in bond strength to 0.7 to 1.2 kg/cm, but maintained hermeticity expressed as a helium leak of $1\times10^{-6}$ atm.cc/sec or less. The package of No. 21 was also lower in bond strength at 0.6 kg/cm (a small decrease from the initial value), but its helium leak was not more than $1\times10^{-6}$ atm.cc/sec. The other packages of Nos. 16, 17, 20, 22–24, 25 and 27 showed no decrease in bond strength, and their hermeticity was kept at $1\times10^{-6}$ atm.cc/sec or less.

The above results clearly show that the packages having the adhesive layers with high moduli of elasticity formed from epoxy resins and polyimide resins are relatively high in the initial bond strength between the base plate and the conductive layer, but evidently have lower adhesion after the various environmental tests; hence, they are inferior in the durability, especially, the durability to thermal shock.

The packages of the present invention, by contrast, have bond strength between the base plate and the conductive layer maintained even after the various environmental tests, demonstrating them to serve as highly durable, highly reliable packages.

The present Examples also showed that the present invention gave highly reliable bonding even when materials with a considerably small difference in coefficient of thermal expansion at 0° to 100° C., a difference as small as $1–3 \times 10^{-6+\circ}C^{-1}$, were bonded together as in the case of aluminum nitride or molybdenum and (Al clad) alloy 42, or even when materials with a considerably great difference in coefficient of thermal expansion, a difference as large as $14–30 \times 10^{-5+\circ}C^{-1}$, were bonded together as in the case of aluminum nitride and copper or zinc, or in the case of aluminum and KV-15.

The base plates of Test Nos. 14 and 16 to 20 had a 3 μm thick Ni electroplating on the entire surface. The Al base plate of Test No. 13 had a 7 μm anodized film on the surface.

The Second Examples

Examples of the package of FIG. 1 prepared using as the adhesives silicone resin adhesives containing fillers are presented. The same type of adhesive as the heat curing organopolysiloxane A in the First Examples and Comparative Examples, which contains SiH groups and vinyl groups, and which is heated together with a chloroplatinic acid catalyst to undergo the addition reaction and form dimethylene crosslinks, resulting in curing, was further mixed with a filler, i.e., alumina having purity of 99.99% or more and an average particle diameter of 0.6 μm and/or silica having purity of 99.99% or more and an average particle diameter of 4.5 μm to prepare pasty adhesives. The proportions of the filler blended are shown in Table 3. The resulting adhesives were each used to bond the base plate to the power layer, the power layer to the ground layer, and the ground layer to the signal layer. The base plate prepared was a 1 mm thick 40×40 mm square plate of aluminum nitride ceramic. The power layer prepared was a 39×39 mm square plate of double-sided Al clad alloy 42 having a 20×20 mm square opening at the center. The ground layer prepared was a 39×39 mm square plate of double-sided Al clad alloy 42 having a 22×22 mm square opening at the center. The signal layer prepared was a single layer having a total of 304 leads, an outer lead pitch of 0.5 mm, and a thickness of 0.15 mm, and also having a 24×24 mm square opening defined at the center. Using these respective materials, the same procedure as in the First Examples and Comparative Examples was performed to prepare packages of the shape illustrated in FIG. 1. The adhesives were each applied to a coating thickness of 100 μm by screen printing, and cured in the air for 2 hours at 150° C. In curing the adhesives, a load of 4 g/cm² was imposed in order to enhance adhesion between the members to be bonded, in contrast to the First Examples and Comparative Examples. In regard to the resulting packages, the amount of the silicone resin adhesive squeezed out of the inside edge of the power layer (the edge defining the 20×20 mm opening) onto the surface of the base plate was measured in terms of the maximum length of the squeeze-out from that inside edge. The results are shown in Table 3.

At the same time, the silicone resin adhesives containing the filler were measured for the modulus of elasticity at 25° C. of the curing product of the adhesive and the bond strength between the base plate and the power layer. The results are also shown in Table 3. The values of the PCT are those measured after 100 hours.

TABLE 3

| | Filler | | | | Modulus of elasticity of | Bond strenth between base plate and power layer (kg/cm) | | | |
|---|---|---|---|---|---|---|---|---|---|
| No. | Material | Amount incorporated (wt. %) | Viscosity (Pa · s) | Squeeze-out (mm) | curing product of adhesive (Kg/cm²) | Initial | After thermal shock test | After dip-soldering test | After PCT |
| 29 | No filler | | 100 | 0.71 | 0.07 | 1.6 | 1.6 | 1.5 | 1.5 |
| 30 | Alumina | 0.8 | 105 | 0.55 | 0.09 | 2.2 | 2.4 | 2.4 | 2.1 |
| 31 | | 5.0 | 110 | 0.34 | 0.10 | 3.4 | 3.3 | 3.5 | 3.3 |
| 32 | | 10.0 | 122 | 0.19 | 0.12 | 4.7 | 4.9 | 5.0 | 4.6 |
| 33 | | 25.0 | 185 | 0.09 | 0.21 | 5.2 | 5.3 | 5.4 | 5.0 |
| 34 | | 45.0 | 820 | 0.03 | 0.42 | 4.0 | 4.1 | 4.2 | 3.9 |
| 35 | | 70.0 | 820 | 0.00 | 1.1 | 3.2 | 3.3 | 3.6 | 3.4 |
| 36 | Silica | 10.0 | 103 | 0.47 | 0.09 | 3.6 | 3.5 | 3.8 | 3.4 |
| 37 | | 25.0 | 165 | 0.39 | 0.16 | 4.5 | 4.6 | 4.8 | 4.7 |
| 38 | | 50.0 | 425 | 0.22 | 0.30 | 3.8 | 3.8 | 4.1 | 3.9 |
| 39 | Blend of 25 wt. % alumina and 30 wt. % silica | | 300 | 0.03 | 0.38 | 4.3 | 4.1 | 4.2 | 4.0 |

As shown above, when the content of the filler was less than 1.0% by weight, the squeeze-out length was greater than 0.5 mm; when it exceeded 80% by weight, the viscosity of the paste increased, making screen printing substantially impossible. The bond strength in the initial stage immediately after bonding, and that after the environmental tests tended to lower slightly as the content of the filler increased. However, the values of the bond strength were all more than 1.5 kg/cm, presenting no problems. As for the hermeticity of the package, even when the filler was incorporated, the values of the helium leak of all packages before and after the environmental tests were $1 \times 10^{-8}$ atm.cc/sec or less, representing a high level of hermeticity.

The Third Examples

The silicone resin adhesive, the base plate, the power layer, the ground layer, and the signal layer were prepared in the same manner as in No. 39 of the Second Examples. Then, a package having an insulating hard resin layer formed on the underside of the inner leads of the leads of the signal layer was produced, as shown in FIG. 4. For the insulating hard resin layer, the following resins were used:

(1) Polyimide resin (R-722, Kabushiki Kaisha Tomoegawa Seishi)

(2) Epoxy resin (UH1W, Kabushiki Kaisha Tomoegawa Seishi)

(3) Fluororesin (PEA Film, Mitsui DuPont Fluorochemical)

The resulting insulating hard resin layers were each processed to a size of 22 mm in length, 2 mm in width and 0.3 mm in thickness, and bonded to the underside of the inner leads by thermocompression.

The packages obtained were evaluated for the ultrasonic output at the time of ultrasonic wire bonding. The wire bonding device was Model 4129 of Kulicke & Soffa, and the wire was a gold wire 35 μm in diameter. The results are shown in Table 4. The ultrasonic output was expressed as a value relative to 100%, provided that the value obtained when no insulating hard resin layer was formed was defined as 100%. When no insulating hard resin layer was formed, a relatively high ultrasonic output was required; whereas the provision of the insulating hard resin layer enabled wire bonding at a reduced ultrasonic output.

bonded together using the heat curing type A silicone resin adhesive containing 25% by weight of silica as the only filler that was shown in the First Examples and Comparative Examples. The adhesive was applied to a coating thickness of 100 μm by screen printing, and cured in the air at 150° C. for 2 hours under a load of 4 g/cm$^2$. The ground layer and the power layer each had 20 outer leads with a pitch of 0.2 mm. The outer leads were stripped of the clad Al, and then tin-plated to a thickness of 4 μm. Then, the outer leads of the power layer and the ground layer were bent, passed along the side surface of the package, and connected at predetermined positions of the signal layer. The connection of the leads to the signal layer was done using a eutectic crystal solder (63% Sn-27% Pb). Using the same solder, solder bumps 0.7 mm in diameter were fixed to the ball grid array.

On the resulting package was mounted a dummy semiconductor device (silicon chip) with an Al deposit (5 μm) on the entire surface. Then, wire bonding involving an Au wire 30 μm in diameter was performed, and a sealing resin was poured into the cavity region for potting of the semiconductor device and the wire for the wire bonding. The molded resin was an epoxy resin (CB-011, Hysol). The so prepared package for evaluation was subjected to reliability tests under the conditions shown in Table 5, and the results shown there were obtained.

The inductance of the power layer and the ground layer was 0.5 nH at 50 MHz. To measure the bond strength between the signal layer (the printed wiring board) and the ground layer, the ground layer bonded onto the printed wiring board was cut to prepare leads with a width of 3 mm

TABLE 4

| No. | Insulating hard resin layer | Modulus of elasticity of insulating hard resin layer (kg/mm$^2$) | Relative supersonic output during wire bonding (%) |
|---|---|---|---|
| 40 | None | — | 100 |
| 41 | Polyimide resin | 910 | 50 |
| 42 | Epoxy resin (glass fiber reinforced) | 810 | 65 |
| 43 | Fluoro resin | 54 | 80 |

The Fourth Example

A package of a shape as illustrated in FIG. 5 was prepared. The base plate was a 0.635 mm thick 40×40 mm square plate of aluminum nitride ceramic. The power layer and the ground layer were each 0.1 mm in thickness, and comprised double-side Al clad alloy 42 (Al thickness: 8 μm on each side). The power layer and the ground layer were platelike and had an opening at the center, as in the Second Examples. The signal layer was a glass epoxy printed wiring substrate (FR-5) with a predetermined wiring pattern. The base plate, the power layer, the ground layer and the signal layer were each. Three of the leads were pulled at a rate of 40 mm/min in a direction of 90° relative to the printed wiring board. The average of the maximum tensile strengths of these three leads was determined as the 90° peel strength. This parameter was assessed in the same manner as in the First Examples and Comparative Examples. Its initial value was 3.8 kg/cm. After the thermal shock test, the dip-soldering test (conducted 5 times) and the PCT (100 h), as conducted in the First Examples and Comparative Examples, its values were 3.8, 4.0 and 4.1 kg/cm, respectively.

TABLE 5

| Reliability test item | Reliability test conditions | Test results |
|---|---|---|
| Thermal cycle | −55~125° C. 10 min each, 1000 cycles | No breakage of wire bond No other abnormality |
| High temparature Bias voltage | 150° C. DC 6 V, 1000 hours | Insulation resistance 10$^{15}$ Ω or more (measured: DC 500 V, 1 min.) |
| High temparature and high humidity Bias voltage | 85° C., 85% RH DC 5.5 V, 1000 hours | Insulation resistance 10$^{10}$ Ω or more (measured: DC 500 V, 1 min.) |
| PCT | 121° C., 2 atmospheric pressure 100% RH, 96 hours | No breakage of wire bond No other abnormality |

TABLE 5-continued

| Reliability test item | Reliability test conditions | Test results |
|---|---|---|
| Mechanical strength | Shock test: MIL883C - 20002.3B<br>Vibration test: MIL883C - 2007.2A | No breakage of wire bond<br>No other abnormality |
| Reflow resistance | •Moisture absorption conditions:<br>30° C./85% RH, 168 hours<br>•Reflow conditions:<br>Maximum temp. 230° C., 1 min.<br>In–out 6 min. 3 passes | No breakage of wire bond<br><br>No other abnormality |

"No other abnormality" means that no cracks of the package, no peeling of the semiconductor device, and no delamination between the base plate and the conductive layer were observed under a 40X stereomicroscope.

The Fifth Examples

Packages of the shape as shown in FIG. 5 were produced using the wide varieties of the materials constituting the base plate, the power layer, the ground layer and the signal layer, a predetermined wiring pattern. The outer leads of the power layer and the ground layer were cleared of Al and then tin-plated for the Al clad material as in the Fourth Example, or were directly tin-plated for the Cu material.

TABLE 6

| | | | | | Bond strength between signal layer and ground layer (kg/cm) | | | | Inductance of power |
|---|---|---|---|---|---|---|---|---|---|
| No. | Base plate | Power layer Ground layer | Signal layer | Type of adhesive | Initial | After thermal shock test | After dip-soldering test | After PCT 100 h | layer and ground layer (nH) |
| 44 | AlN | Al clad alloy 42 | Glass epoxy | F | 3.5 | 3.5 | 3.7 | 4.0 | 0.4–0.5 |
| 45 | | Al clad alloy 42 | Glass epoxy | G | 4.0 | 4.3 | 4.4 | 4.4 | |
| 46 | | Al clad alloy 42 | Glass epoxy | I | 1.1 | 1.1 | 1.2 | 0.8 | |
| 47 | | Al clad alloy 42 | Alumina | J | 4.1 | 4.2 | 4.8 | 4.7 | |
| 48 | | Al clad Cu | Glass epoxy | J | 3.8 | 3.8 | 4.0 | 4.1 | 0.3–0.4 |
| 49 | | Al clad Cu | Glass epoxy | H | 3.9 | 3.8 | 3.9 | 3.5 | |
| 50 | Cu | Al clad Cu | Glass epoxy | F | 3.5 | 3.5 | 3.7 | 4.0 | |
| 51 | | Al clad Cu | BT resin | F | 3.7 | 3.9 | 3.8 | 3.5 | |
| 52 | Al | Al clad alloy 42 | BT resin | J | 4.3 | 4.3 | 4.4 | 4.2 | 0.4–0.5 |
| 53 | Cu | Al clad alloy 42 | Alumina | J | 5.1 | 5.3 | 5.2 | 5.5 | |
| 54 | | Cu | BT resin | J | 4.3 | 4.3 | 4.4 | 4.2 | 0.2–0.3 |
| 55 | | Al clad alloy 42 | Alumina | J | 1.5 | 1.6 | 1.5 | 1.1 | 0.4–0.5 |
| 56 | Glass epoxy | Al clad alloy 42 | Alumina | J | 5.1 | 5.3 | 5.2 | 5.5 | |
| 57 | | Cu | Alumina | J | 5.1 | 5.3 | 5.2 | 5.5 | 0.2–0.3 |
| 58 | | Cu | BT resin | J | 4.3 | 4.3 | 4.4 | 4.2 | |
| 59 | | Cu | Glass epoxy | J | 3.8 | 3.8 | 4.0 | 4.1 | |
| 60 | | Cu | Glass epoxy | E | 3.0 | 3.2 | 3.2 | 3.5 | |
| 61 | | Cu | Glass epoxy | I | 1.1 | 1.1 | 1.2 | 0.8 | | as well as the adhesives for them, as shown in Table 6. The adhesives were the silicone resin adhesives, types E to J, indicated in the First Examples and Comparative Examples. The same method as in the Fourth Example was employed in producing the packages. The curing conditions complied with those for the types E to J revealed in Table 1. The bond strength between the signal layer and the ground layer was evaluated in the same manner as in the Fourth Example. If the base plate was made of Cu, it was Ni-plated to a thickness of 4 μm on the entire surface. The resulting packages were measured for the inductance of the power layer and the ground layer at 50 MHz. The results are presented in Table 6.

The reliability tests of the packages were conducted in the same way as in the Fourth Example, and similar results to the Fourth Example were obtained.

In regard to the signal layer shown in Table 6, "glass epoxy" refers to a glass epoxy printed wiring board (FR-5), "alumina" refers to an alumina multilayer substrate with a tungsten (W) inside layer wiring and W via holes, and "BT resin" refers to a BT (bismaleimide triazine) resin printed multilayer wiring board, each substrate being provided with

What we claim is:

1. A package for mounting a semiconductor device, comprising
a base plate, and
a plurality of conductive layers comprising a power layer, a ground layer and signal layer,
one of said conductive layers laminated onto said base plate via an adhesive layer,
the remaining conductive layers laminated together and to said conductive layer laminated onto said base plate via an adhesive layer interposed between adjacent layers,
wherein the modulus of elasticity at 25° C. of said adhesive layers is 10 Kg/mm$^2$ or less.

2. The package of claim 1 wherein the 90° peel strength between the base plate and the conductive layer is 0.5 kg/cm or more.

3. The package of claim 2 wherein the 90° peel strength between the base plate and the conductive layer is 1 kg/cm or more.

4. The package of claim 1 wherein the modulus of elasticity at 25° C. of the adhesive layer is 0.01 to 10 kg/mm$^2$.

5. The package of claim 4 wherein the modulus of elasticity at 25° C. of the adhesive layer is 0.03 to 5 kg/mm$^2$.

6. The package of claim 5 wherein the modulus of elasticity at 25° C. of the adhesive layer is 0.05 to 2 kg/mm$^2$.

7. The package of claim 1 wherein the adhesive layer is composed of an adhesive containing a filler.

8. The package of claim 7 wherein the filler is silica or alumina or a mixture of silica and alumina.

9. The package of claim 7 wherein the average particle diameter of the filler is 0.1 to 100 μm.

10. The package of claim 9 wherein the average particle diameter of the filler is 0.3 to 30 μm.

11. The package of claim 7 wherein the amount of the filler incorporated is 1 to 80% by weight based on the entire adhesive including the filler.

12. The package of claim 11 wherein the amount of the filler incorporated is 5 to 70% by weight based on the entire adhesive including the filler.

13. The package of claim 1 wherein the viscosity of the adhesive layer when applied to said conductive layers for laminating said conductive layers together and to said base plate is 50 to 1000 Pa's.

14. The package of claim 1 wherein the thickness of the adhesive layer is 0.005 to 3 mm.

15. The package of claim 1 wherein the base plate is an aluminum nitride ceramic.

16. The package of claim 1 wherein the signal layer is composed of a multiplicity of leads.

17. The package of claim 16 wherein an insulating hard resin layer is disposed on the inner surface of each of the inner leads of the multiple leads.

18. The package of claim 1 wherein a multiplicity of outer connecting terminals are disposed on an exterior surface of said baseplate, a first connecting means electrically connecting said power layer to at least one of said outer connecting terminals, and a second connecting means electrically connecting said ground layer to at least another outer connecting terminal.

* * * * *